United States Patent
Clabburn et al.

(10) Patent No.: US 7,232,651 B2
(45) Date of Patent: Jun. 19, 2007

(54) OPTICAL RECORDING MATERIALS

(75) Inventors: Robin J. T. Clabburn, Sevenhampton (GB); Rifat Iqbal, Stoke on Trent (GB); Stephen Moratti, Cambridge (GB)

(73) Assignee: Microsharp Holdings Limited (GB)

( * ) Notice: Subject to any disclaimer, the term of this patent is extended or adjusted under 35 U.S.C. 154(b) by 41 days.

(21) Appl. No.: 10/416,397

(22) PCT Filed: Nov. 9, 2001

(86) PCT No.: PCT/GB01/04981

§ 371 (c)(1),
(2), (4) Date: Oct. 16, 2003

(87) PCT Pub. No.: WO02/39185

PCT Pub. Date: May 16, 2002

(65) Prior Publication Data

US 2004/0219457 A1 Nov. 4, 2004

(30) Foreign Application Priority Data

| Nov. 10, 2000 | (GB) | ................................. 0027580.0 |
| Dec. 1, 2000 | (GB) | ................................. 0029403.3 |
| Apr. 20, 2001 | (GB) | ................................. 0109809.4 |

(51) Int. Cl.
G03C 5/16 (2006.01)
G03C 1/73 (2006.01)
G03C 1/815 (2006.01)
G03F 7/075 (2006.01)
G02B 26/00 (2006.01)

(52) U.S. Cl. ................ 430/321; 430/281.1; 430/285.1; 430/283.1; 430/284.1; 430/916; 359/237; 359/298; 359/586; 359/599

(58) Field of Classification Search ............ 430/270.1, 430/281.1, 285.1, 286.1, 283.1, 284.1, 280.1, 430/916, 321, 330
See application file for complete search history.

(56) References Cited

U.S. PATENT DOCUMENTS

| 3,658,526 | A | | 4/1972 | Haugh |
| 4,842,968 | A | | 6/1989 | Kojima et al. |
| 4,942,112 | A | | 7/1990 | Monroe et al. |
| 4,963,471 | A | | 10/1990 | Trout et al. |
| 5,149,592 | A | * | 9/1992 | Wojnarowicz ............ 428/447 |
| 5,442,482 | A | | 8/1995 | Johnson et al. |
| 5,470,662 | A | | 11/1995 | Weber et al. |
| 5,695,895 | A | | 12/1997 | Johnson et al. |
| 5,702,846 | A | | 12/1997 | Sato et al. |
| 5,726,728 | A | * | 3/1998 | Kondo et al. ............ 349/156 |
| 5,858,614 | A | * | 1/1999 | Sato et al. ............ 430/280.1 |

(Continued)

FOREIGN PATENT DOCUMENTS

EP 0 294 122 A 5/1988

(Continued)

*Primary Examiner*—Sin Lee
(74) *Attorney, Agent, or Firm*—The Webb Law Firm

(57) ABSTRACT

A photopolymerisable system is disclosed which can be polymerised by exposure to UV light, for example, to form a solid, light-transmitting sheet material having volume refractive index variations defining an optical diffuser or a hologram, for example. The system includes a silicone monomer, prepolymer, macromonomer or co-monomer capable of undergoing free radical initiated polymerization and further includes a photoinitiator.

24 Claims, 7 Drawing Sheets

U.S. PATENT DOCUMENTS

| | | | |
|---|---|---|---|
| 5,861,444 A | 1/1999 | Tsukamoto et al. | |
| 5,932,342 A * | 8/1999 | Zeira et al. | 428/327 |
| 6,411,368 B1 * | 6/2002 | Matsumoto et al. | 355/67 |
| 6,744,502 B2 * | 6/2004 | Hoff et al. | 356/317 |
| 2003/0035917 A1 * | 2/2003 | Hyman | 428/67 |

FOREIGN PATENT DOCUMENTS

| | | |
|---|---|---|
| EP | 0 407 771 A | 1/1991 |
| EP | 0 768 565 A2 | 10/1996 |
| WO | WO 97/13183 A | 4/1997 |

* cited by examiner

OPTICAL RECORDING MATERIALS

CROSS REFERENCE TO RELATED APPLICATION

This application contains subject matter which is disclosed in co-pending application PCT/GB01/04973, filed in the United States concurrently herewith.

BACKGROUND OF THE INVENTION

1. Field of the Invention

THIS INVENTION relates to optical recording materials and to methods of forming optical devices such as diffusers and holograms from such materials. The present specification discloses, inter alia, various systems or mixtures of components which can be provided in the form of an extended layer and which are of such a character that when such an extended layer of such system or mixture is exposed to light or other appropriate radiation, at least some components of the system undergo polymerisation in the areas so exposed, whereby an end product is obtainable, (after any necessary processing steps), which comprises a solid, transparent, or at least light-transmitting sheet or layer characterised by refractive index variations and/or characterised by variations in layer thickness, i.e. by surface relief features. Such systems are useful, for example as holographic recording materials, or in the production of microlens arrays, or of light-diffusing or de-pixelating screens.

2. Description of Related Art

Typically, known systems for the purpose referred to comprise a monomer or monomers capable of undergoing free-radical-initiated polymerisation, a photo-initiator capable of generating free radicals on exposure to radiation of the required wavelengths and a polymeric matrix or binder. Examples of such known systems or mixtures are disclosed in for example U.S. Pat. Nos. 5,470,662 4,963,471, 4,942,112, 3,658,526.

SUMMARY OF THE INVENTION

It is among the objects of the present invention to provide an improved photopolymerisable system or mixture.

According to one aspect of the invention there is provided a photopolymerisable system capable of polymerisation to form a solid, light-transmitting material having volume refractive index variations and/or surface relief features dependent on the exposure of the system to polymerising radiation, wherein the system includes a silicone acrylic compound or compounds.

According to another aspect of the invention there is provided a system capable of being modified by electromagnetic radiation to provide a transparent or substantially transparent material having volume refractive index variations, or surface contour features, determined by exposure of the system to such radiation, the system comprising:—

(a) a silicone pre-polymer, or a monomer, co-monomer, macromonomer or prepolymer incorporating a silicone monomer or pre-polymer, (b) an ethylenically unsaturated monomer capable of undergoing free-radical initiated polymerisation, and (c) a photo-initiator capable of generating free radicals upon excitation by such radiation.

The system may additionally include a compatible polymer, e.g. polymers or copolymers with similar groups to the silicone prepolymer. Compatible polymers which may be used include PVA, polysiloxane polymers or acrylic type polymers such as PMMA.

It is another object of the invention to provide an improved light-modifying structure using a system or mixture in accordance with the above noted aspect as a starting material.

According to this aspect of the invention, there is provided a diffuser, hologram or other light-modifying structure formed by polymerisation of a system in accordance with the previously noted aspects of the invention.

It is also among the objects of the present invention to provide a light-diffusing material by exposure of a photo-polymerisable system or mixture to polymerising radiation without requiring an optical mask or screen.

According to another aspect of the invention there is provided a method of making a light-diffusing material comprising providing a photopolymerizable system capable of polymerization to form a solid, light-transmitting material having volume refractive index variations and/or surface relief features dependent on the exposure of the system to polymerizing radiation, and which method comprises exposing a layer provided by said system to polymerizing radiation through an optical aperture screen to polymerize the material and subsequently polymerizing any of the material still unpolymerized.

According to yet another aspect of the invention there is provided a method of making a light-diffusing material comprising providing a photopolymerisable system capable of polymerisation to form a solid, light-transmitting material having volume refractive index variations and/or surface relief features dependent on the exposure of the system to polymerising radiation, and which method comprises exposing a layer provided by said system to polymerising radiation without any intervening mask and without other means of producing small scale variation of light intensity with position in the layer.

Preferably said system includes a silicone acrylate or similar compound or compounds.

The polymerising radiation is preferably parallel (collimated) or substantially parallel radiation.

According to still another aspect of the invention, there is provided a diffuser formed by the above method.

In preferred embodiments of the invention, the system comprises:

(a) a silicone pre-polymer, or a monomer, co-monomer, macromonomer or prepolymer incorporating a silicone monomer or pre-polymer, (b) an ethylenically unsaturated monomer or prepolymer capable of undergoing free-radical-initiated polymerisation, and (c) a photo-initiator capable of generating free radicals upon excitation by such radiation.

Examples of component (b) which may be used include:

Acrylate/Methacrylate Groups
PPTTA (polyetherpolyoltetraacrylate) RI=1.4772
ACMO (Acryloyl Morpholine) RI=1.53
Sartomer 355, SR-355, DTMPTTA, (Di-Trimethylolpropane tetraacrylate RI=1.4758
Sartomer 399, SR-399, DiPEPA, (Dipentaerythritol pentaacrylate) RI=1.4885
Ebecryl 2047 (Trifunctional acrylate) R1-1.4757
Genomer 4302 (Aliphatic Polyester Triurethane Triacrylate, hazardous component being urethane acrylate 100%) RI-1.509

Photomer 4810 F (Ester of acrylic acid and isoC$_{10}$ alcohol) or Isodecyl (IDA) C10 acrylate RI=1.4395
Photomer 4072 (Trimethylol Propoxylate (3) Triacrylate) RI=1.464
Sartomer 415 or SR-415 (Ethoxylated (20) Trimethylolpropane Triacrylate) RI=1.4699
Sartomer 492 or SR-492 (Propoxylated Trimethylolpropane Triacrylate) RI=1.459
Genomer 4269/M22 (aliphatic difunctional urethane acrylate diluted in Genomer 1122 (monofunctional, aliphatic urethane acrylate)) RI=1.4785
Trimethylolpropane triacrylate (TMPTA)
2-Phenoxyethyl acrylate (POEA)
2-Phenoxyethyl methacrylate
Phenyl ethoxylate monoacrylate
2-(p-Chlorophenoxy) ethyl acrylate
Phenyl acrylate
2-(1-Naphthyloxy) ethyl acrylate Urethane methacrylates such as supplied under the Trade name "Genomer 4302", or any of the ethylenically unsaturated monomers capable of free radical initiated addition polymerisation identified as such in any of U.S. Pat. Nos. 5,470,662; 4,963,471; 4,942,112; or 3,658,526. In particular, it may be beneficial to use polyester or polyether acrylates, which may impart flexibility to the polymerised material.

Vinyl Groups
Poly(dimethylsiloxane), vinyl terminated—viscosity 850-1150 cst
N-vinyl pyrrolidinone (NVP)
Ethyl 1-benzoyl-2-vinyl-1-cyclopropane carboxylate The system may additionally include a compatible polymer, e.g. polymers or copolymers with similar groups to the silicone prepolymer. Compatible polymers or binders which may be used include PVA, polysiloxane polymers or acrylic-type polymers such as PMMA. Thus the formulation may include:

Binders
PVA MW 12800
PVA MW 10-15000
PMMA MW 3300-996000

In practice, there may be added to the formulations of the above system (i.e. silicone acrylate and monomer blends; silicone acrylate or silicone methacrylate alone; silicone/acrylate monomer blends), various other components such as flexibilisers, binders, other monomers, stabilisers, defoamers, antioxidants, photoinitiators and amine synergists.

Examples of materials in these classes which may be used are set out below:

Flexibilizer
Tri(ethylene glycol) RI=1.4550
Poly(ethylene glycol)methyl ether (average Mn ca. 5,000, T$_m$52°)
Photomer 4810 F. (Ester of acrylic acid and iso C10 alcohol) or Isodecyl (IDA) C10 acrylate RI=1.4395

The addition of such flexibilisers was found to be beneficial, allowing the production of good diffuser films with good to adequate flexibility.

Binders
PVA MW 12800
PVA MW 10-15000
PMMA MW 3300-996000
Other monomers (vinyl, acrylate groups)

Defoamers
Rhodoline 646
Dehydran 1620

Stabilizers
4-Methoxyphenol
2,4-Dihydroxybenzophenone

Photoinitiators

Photoinitiator Type I
Daracure 1173 or 2-hydroxy-2-methyl-1-phenyl-1-propanone
Genocure DMHA or 2-hydroxy-2-methyl-1-phenyl-1-propanone
Genocure MBF (methyl benzoyl formate aromatic ketone) RI=1.5270
Irgacure 184 (1-hydroxycyclohexylphenylketone)
Irgacure 369 (2-benzyl-2-(dimethylamino)-4'-morpholinobutyrophenone)
Lucrin TPO (diphenyl(2,4,6-trimethylbenzoyl)phosphine oxide)

Photoinitiator Type II
4-(p-tolylthio)benzophenone (Type II initiator)
Speedcure ITX (a mixture of 2-isopropylthioxanthanone and 4-isopropylthioxanthanone—a Type II initiator which requires an amine synergist)
Speedcure DETX [(2,4-diethylthioxanthanone)— a Type II initiator which requires an amine synergist]
Speedcure EDB (ethyl-4-(dimethylamino)benzoate (amine synergist))
Speedcure PDA (poly[oxy(methyl-1,2-ethanediyl)] alpha-[(dimethylamino)benzyl-w-butoxy] (amine synergist))

Oxygen Bitors Which may be Used Include
ethyl-4-dimethylaminobenzoate
aminobenzoate derivative such as that supplied under the Trade name "Speedcure PDA" (amine synergist)
triethylamine
oligoamines, such as supplied under the Trade name "Genomer 5248 and 5275"
Ethyl-4-(dimethylamino) benzoate amine synergist). Trade name Speedcure EDB.

Actilane 800 is a silicone difunctional acrylate product from Akros Chemicals Ltd., Manchester; Daracure 1173 is 2-hydroxy-2-methyl-1-phenyl-1-propanone; NVP is N-vinyl pyrrolidinone; PVA is poly(vinyl acetate) MW 12,800; TMPTA is trimethylolpropane triacrylate; POEA is 2-phenoxyethyl acrylate; Rahn 99-662 is a silicon acrylate, a product from RAHN AG, Switzerland.

The Actilane 800 and Rahn 99-622 materials referred to are examples of materials referred to generally as silicone acrylates, and are also known as acrylate terminated poly(dimethylsiloxanes) (PDMS). Silicone acrylates useful in the context of the invention may also include aliphatic, phenyl, other aromatic or cyclic groups, or vinyl groups in addition to or as an alternative to methyl groups.

In variants of the invention, other silicone copolymers such as silicone methylacrylates or silicone acrylamide and silicone epoxy pre-polymers may be used instead of the silicone acrylate prepolymers referred to herein.

BRIEF DESCRIPTION OF THE DRAWINGS

In the accompanying drawing.

DETAILED DESCRIPTION OF THE PREFERRED EMBODIMENTS

Figure 1:
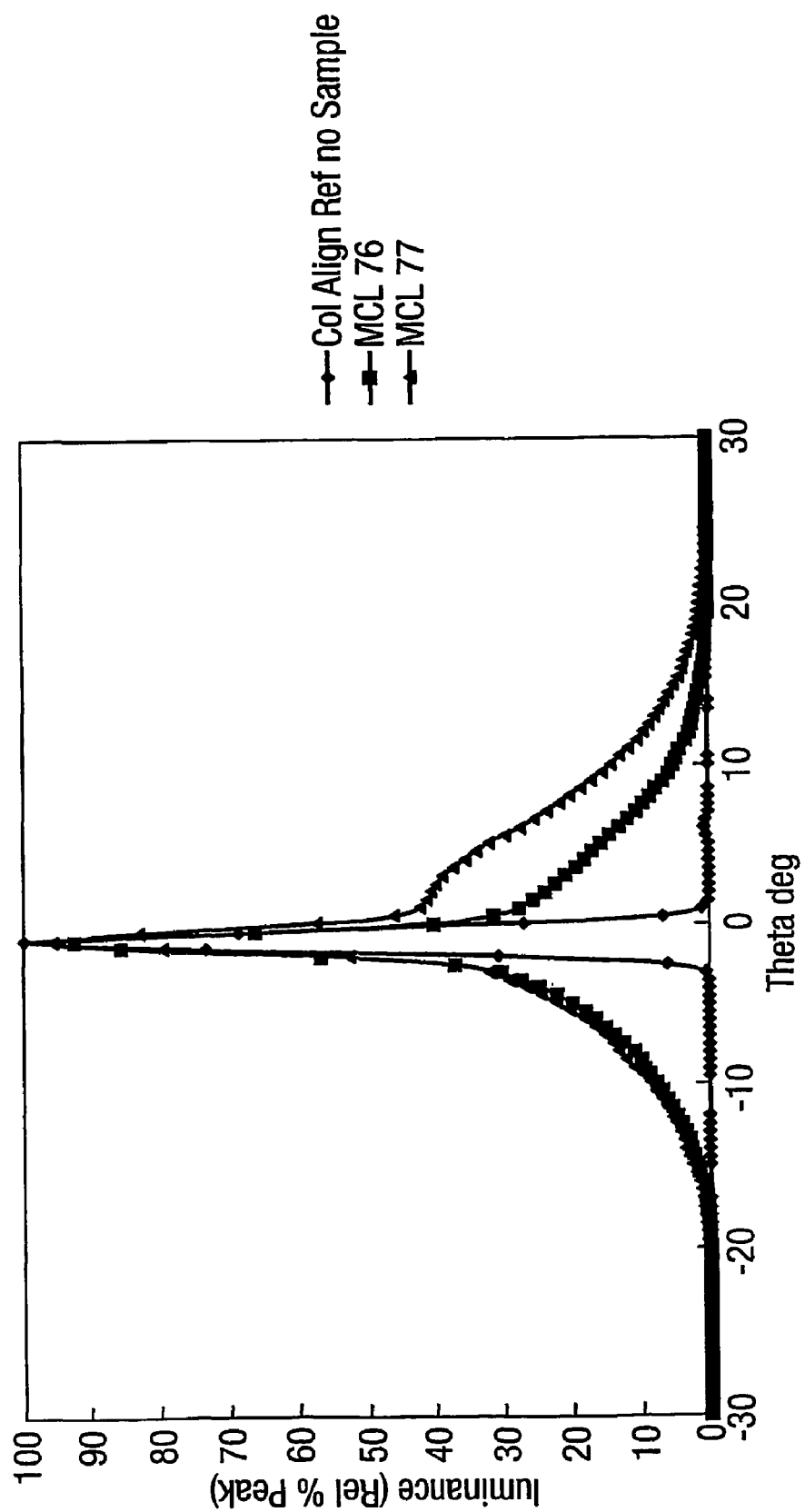
FIG. 1 is a graph showing, for various diffusers according to the invention, variation of luminance with angle (theta) of observation (on one side of the diffuser) from the axis of incidence of a collimated beam directed normally onto the diffuser from the opposite side thereof.

In some embodiments of the invention described in the following, a light-diffusing screen, for use as a rear projection screen or a depixelating screen, is made by a technique similar to that disclosed in European Patent No. 0294122 or European Patent No. 0530269, and in which technique, a layer of photopolymerisable material is applied to an optical mask featuring a plurality of light-transmitting apertures or windows in an opaque background or a plurality of opaque spots or patches in a light-transmitting background, these apertures or patches being on a microscopic scale (typically about 2 microns, and up to about 10 microns maximum dimension). In what follows, some examples are given of the manufacture of optical diffusers using masks substantially of the kind disclosed in EP-0801767. In these examples, the mask took the form of a photographic negative or transparency in the conventional form of a glass plate bearing on one side a gelatine layer incorporating opaque silver grains. In the examples of this character given below, the photopolymerisable mixture or system was coated directly onto the gelatine side of the prepared mask. In other examples below optical diffusers are manufactured by a process which is similar but in which no mask is used, the photopolymerisable mixture or system being coated directly onto a plain, transparent sheet or film.

In the examples in which masks were used, they were prepared by being cleaned in acetone or chloroform or a 5% solution of "Decon Neutracon" in acetone or a 5% solution of "Decon Neutracon" in distilled water. After such cleaning, the mask was dried, then a 1% solution of Glassclad 18 (a proprietary release agent) in distilled water was applied for 10 to 20 seconds to the gelatins side of the mask, whereafter the mask was air-dried for 24 hours. In the examples in which no mask was used, a plain glass plate or tile was used instead of a developed photographic plate, the plain glass plate being prepared by cleaning in acetone.

In the "screen printing technique", in each case a template (i.e. a border or "frame" of plastics film defininig a central aperture to receive the polymerisable material) was placed on the glass tile or optical mask. Having stirred the polymerisable formulation, a sufficient quantity was placed in the well, defined by said aperture, taking care to avoid bubbles as far as possible. A piece of Mylar (R.T.M.) (polyester) with a release coating was placed over the top, taking care to place the side with the release coating facing the quantity of the formulation and a roller was passed over the top of the assembly to allow the formulation to spread out evenly filling the well within the template.

The tile or mask with the Mylar side down was placed in an ultra-violet light exposure apparatus under a source of ultra-violet light for a standard period, (e.g. two minutes). Thus, where an optical mask of the kind referred to was used, the photopolymerizable material was first exposed through the mask (a "contact printing" technique). The tile or plate was then turned over and similarly exposed for a further period to provide a "blanket" exposure. The film was then carefully separated from the glass or mask, Mylar and template, for optical testing and evaluation. As the polymerization of the systems in accordance with the invention is in general inhibited by contact with oxygen, it is necessary to exclude oxygen, either by providing a covering layer of impermeable material such as plastic film or by a blanket of inert gas, during exposure, Because the formulations exemplified are liquid until polymerized, it is normally appropriate to provide, between the glass plate and the superimposed film, a spacer or template in the form of a frame bounding the region occupied by the polymerizable system, such spacer of frame being, for example, of plastic film of the appropriate thickness.

In the examples in which a mask was used, the optical density of the mask was typically 1.6. Optical density is defined in accordance with the following equation:

$$\text{Transmittance} = \frac{1}{10^{OD}}.$$

Where transmittance is the proportion of the light striking the mask which is allowed to pass through it and OD is the optical density. An optical density of 1.6 allows about 3% of the light to pass through.

Table 1 below sets out, for each of a plurality of trials, the respective formulation in accordance with the invention, (the components of each formulation or system being set out under the heading "Formulation"), the portions of the respective components, (these being set out in the column headed "Parts" in the same sequence as set out in the column "Formulation"), the optical density of each mask being set out in the column headed "Mask" and the characteristics of the resulting diffuser being summarised in the column headed "Comments". In the first column of the Table 1 the characters in the brackets in the first column are codes identifying the particular system of formulation concerned. These codes are used to identify the respective formulations in the discussion below.

In the "Comments" section in Table 1, the indications "SURFACE RELIEF" and "VOLUME EFFECT" indicate respectively that the light-diffusive effect appeared to be entirely or almost entirely due to surface relief produced in accordance with the mask pattern, and that at least a significant part of the light-diffusing effect appeared to be due to refractive index variations within the bulk of the photopolymer layer. Whether the light-diffusing effect was due to surface relief or to refractive index variations in the volume of the photopolymer layer was assessed by application of an index matching fluid such as propan-2-ol to the free surface of the photopolymer. If such application of propan-2-ol removed the light-diffusive effect the diffusion was considered to be due to surface relief, whereas if it did not, the diffusion was considered to be due to refractive index variations in the volume of the material.

TABLE 1

UV - curing of various formulations

| FORMULATION (CODE) | PARTS | MASK OD | COMMENTS |
|---|---|---|---|
| Actilane 800, Daracure 1173, NVP, (MCL 63) | 100:8:82 | 1.94 | Formed a slightly cloudy diffuser. SURFACE RELIEF |
| Actilane 800 Daracure 1173, NVP, PVA, (MCL 65) | 50:3:50:8 | 1.91 | Formed a slightly cloudy diffuser. SURFACE RELIEF |
| Actilane 800, Daracure 1173, NVP, TMPTA, (MCL 70) | 75:3:50:25 | 1.25 | Formed a fairly good cloudy diffuser and the film was flexible. VOLUME EFFECT |
| Actilane 800, Daracure 1173, NVP, POEA, (MCL 71) | 75:3:50:25 | 1.25 | Formed a good cloudy diffuser and film was flexible. VOLUME EFFECT |
| Actilane 800, TMPTA, Daracure 1173, PVA (MCL 73) | 50:50:3:17 | 1.89 | Formed a cloudy diffuser, which was not very flexible and quite tough. VOLUME EFFECT |
| Rahn 99-622 Daracure 1173, TMPTA (MCL 76) | 75:3:25 | 1.94 | UV-cured photopolymer adhered to the gelatin surface, but peeled away easily and was remounted onto mylar. Formed a cloudy diffuser, which was fairly flexible. VOLUME EFFECT |
| Rahn 99-622, Daracure 1173, POEA (MCL 77) | 75:3:25 | 1.62 | UV-cured photopolymer adhered to the gelatin surface, but peeled away easily and was remounted onto mylar. Formed a very good cloudy diffuser. VOLUME EFFECT |
| Rahn 99-622, Daracure 1173, NVP (MCL 78) | 67:3:33 | 1.14 | UV-cured photopolymer adhered to the gelatin surface, but peeled away easily and was remounted onto mylar. Formed a fairly good cloudy diffuser that was brittle to the edges of the film. VOLUME EFFECT |
| Rahn 99-662, Daracure 1173, NVP (MCL 78) | 67:3:33 | 1.07 | UV-cured photopolymer adhered to the gelatin surface, but peeled away easily and was remounted onto mylar. Formed a fairly good cloudy diffuser that was brittle at the edges of the film. VOLUME EFFECT |
| Rahn 99-662, Daracure 1173, NVP, TMPTA (MCL 82) | 75:3:50:25 | 1.14 | UV-cured photopolymer adhered to the gelatin surface and was very brittle. Did not form a very good diffuser. SURFACE RELIEF |
| Rahn 99-662, Daracure 1173, NVP, POEA (MCL 83) | 75:3:50:25 | 1.14 | UV cured photopolymer adhered to the gelatin surface, was very hard and not at all flexible. Formed a fairly good diffuser. VOLUME EFFECT |
| Rahn 99-622, TMPTA, Daracure 1173, PVA, (MCL 85) | 50:50:3:17 | 1.91 | Formed a cloudy diffuser. The film was fairly flexible. SURFACE RELIEF |

Figure 11:
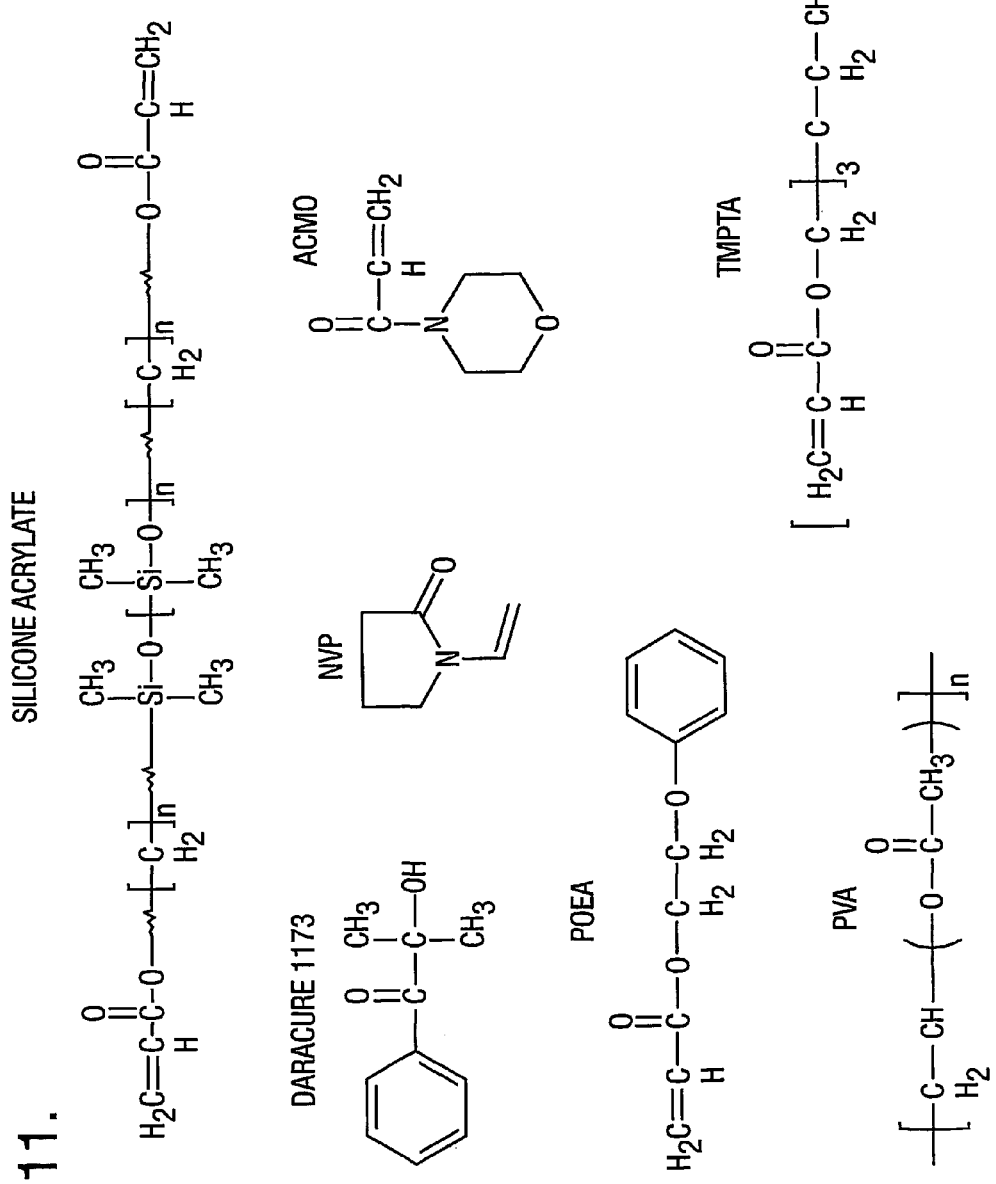

The photopolymerisation of some of the systems in accordance with the present invention is believed to be somewhat complex, in that it is believed that significant copolymerisation with the monomeric components (such as the NVP, POEA or TMPTA, etc. (also illustrated in FIG. 11)), takes place and quite possibly a degree of crosslinking between the monomers (TMPTA, etc.,) and the silicone acrylate and even between these and the PVA (where present).

It is hypothesised that, during exposure of a system in accordance with the invention to UV, through an optical mask, as described, the mechanism involved is as follows:

Initially, during the exposure, photopolymerisation of the silicone acrylate and monomer commences in the immediate area exposed to ultra-violet light, followed by migration, by diffusion, of monomer and silicone prepolymer from the unexposed regions into the exposed regions, accompanied by further polymerisation, including co-polymerisation, and even a degree of cross-linking, in the exposed regions, leaving a deficit of prepolymer and monomer in the unexposed areas.

The PVA incorporated in some of the formulations indicated is added in order to increase the viscosity of the system, to assist in handling and processing of the coated masks, and to improve the mechanical properties of the end product, by improving flexibility etc., the PVA being effectively dissolved in the monomer and polymer. It is believed however, that during the UV curing described, some (beneficial) chemistry involving the PVA may also take place, including bonding or cross-linking with the monomer and/or with the functional groups of the silicone acrylate. The alternatives to PVA noted herein by way of further compatible polymers likewise serve to increase viscosity of the uncured system and to improve flexibility in the end product.

As noted in Table 1, Formulation MCL 63 (Actilane 800 with NVP) forms a diffuser that exhibits surface relief. The addition of PVA, as in Formulation MCL 65, does not change this result. The use of a cross-linker such as TMPTA with the Actilane 800 as in Formulation MCL 70 forms a diffuser that exhibits volume graded refractive index effects, i.e. a diffuser in which within the photopolymer material, the refractive index varies from position to position. The addition of PVA as in Formulation MCL 73 does not change this result. This particular formulation (MCL 73) formed a very hard film. The mixture was very viscous before being UV-cured. The addition of POEA to the Actilane 800 Formulation MCL 71 led to a diffuser which exhibited graded refractive index volume effects POEA is an aromatic acrylate also known as ethylene glycol phenyl ether acrylate and has a reasonably high refractive index (RI) of 1.5180. Acrilane 800 has a RI 1.4590. Formulations MCL 70 and MCL 71 in the Table had favourable light-diffusing characteristics. A favourable formulation is MCL 77 in Table 1.

As regards the other formulations in Table 1, Rahn 99-622 forms with TMPTA (MCL 76), POEA (MCL 77) or NVP (MCL 78) a diffuser that exhibits bulk-refractive index variation effects. Variant systems may include PVA and a compatible organic solvent. A further option would be to use poly(vinyl formal) or poly(vinyl butyral) (PVB) to improve refractive index modulation. The combination of Rahn 99-622 with NVP and TMPTA (MCL 82) forms a diffuser that relies mainly on surface relief. However, with NVP and POEA (MCL 83) a diffuser is produced which exhibits volume refractive index variations. The combination of Rahn 99-622, TMPTA and PVA (MCL 85) formed a surface relief diffuser that did not stick to the gelatine. It would be interesting to examine the addition of NVP and POEA to formulation MCL 85.

Whilst in the examples noted above, the photopolymerisable system or formulation was coated directly onto the gelatine surface of a photographic negative or transparency, it should be understood that in many cases, for example, where a holographic recording material is to be supplied to end users, the recording material may comprise a product in the form of the photopolymerisable system or formulation in accordance with the invention sandwiched between a relatively inert and ideally transparent sheet, for example, sandwiched between two sheets of Mylar (polyester) film. Such a product may be made, for example, by modifying a formulation such as indicated by MCL 73 or MCL 85 in Table 1, by increasing the proportion of PVA and including a compatible solvent for the PVA (such as MEK), to provide a formulation of a viscosity low enough to allow it to be readily applied as a coating, and coating the fluid system onto one Mylar film in a coating apparatus, known per se, for applying a coating of uniform thickness, the second Mylar film subsequently being applied to the exposed surface of the photopolymerisable layer.

Table 2 below sets out refractive indices of the components of the formulations to which Table 1 relates.

TABLE 2

| CHEMICAL | REFRACTIVE INDEX |
| --- | --- |
| Actilane 800 | 1.4590 |
| Rahn 99-622 | 1.4714 |
| Rahn 00-225 | 1.4623 |
| Daracure 1173 | 1.5316 |
| NVP | 1.5120 |
| ACMO | 1.53 |
| POEA | 1.516 |
| TMPTA | 1.476 |

TABLE 2-continued

| CHEMICAL | REFRACTIVE INDEX |
| --- | --- |
| PPTTA | 1.4772 |
| PVA | 1.4660 |

Figure 2:
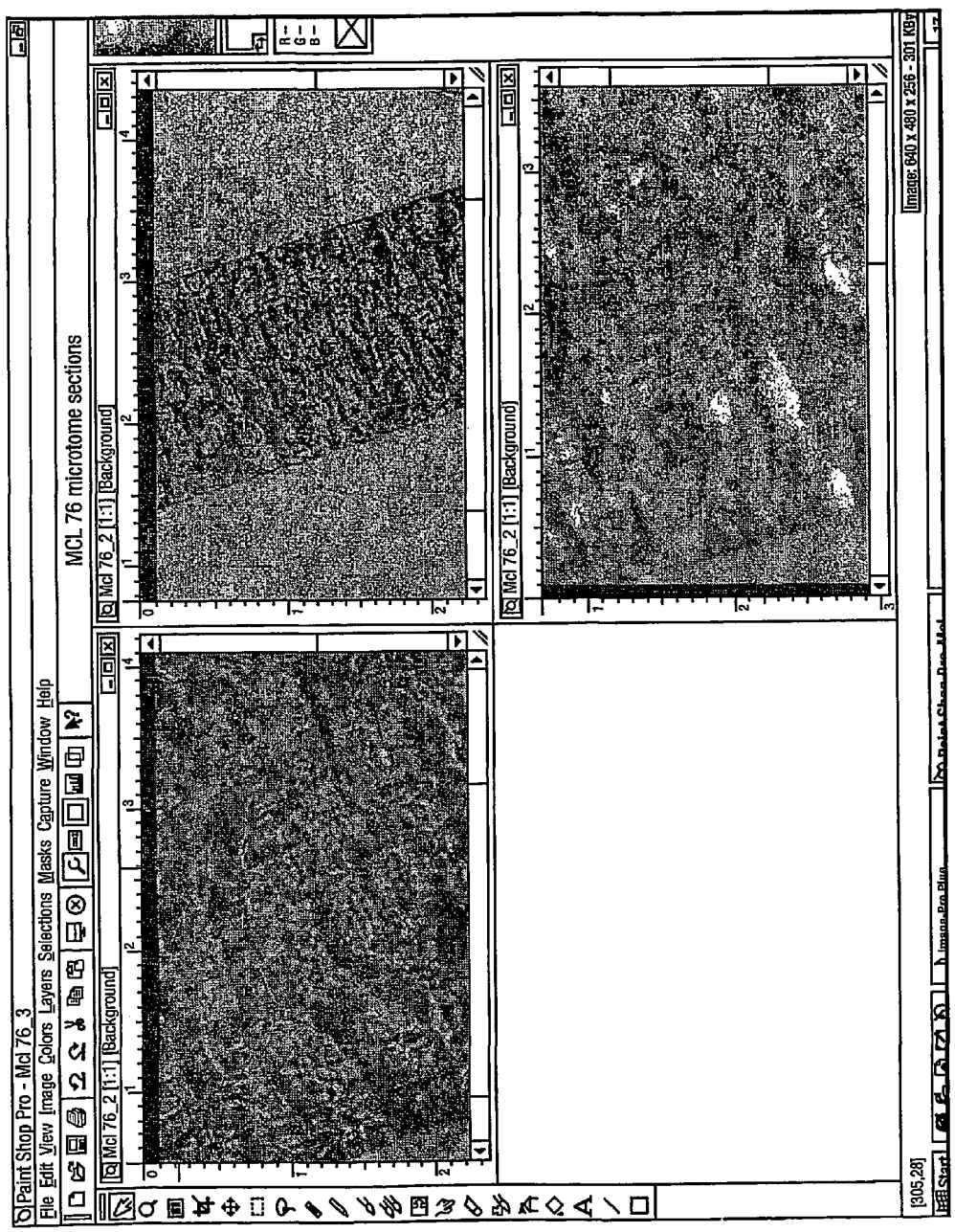
FIG. 2 shows micrographs of sections (perpendicular to the major plane of the photopolymerised layer), through a diffuser in accordance with the invention.

Referring to FIGS. 1 and 2, FIG. 1 shows angle of view characteristics for formulations MCL 76 and MCL 77 of about 10 and 16 degrees respectively. Angle of View for a light-transmitting light diffusing sheet is typically measured by directing a collimated light beam onto the sheet from one side and measuring, on the opposite side of the sheet, the intensity of the light emanating from the sheet over a range of angles with respect to the collimated beam. The Angle of View in such a scenario is defined as the included angle over which the light intensity thus measured is 50% or more of the peak intensity so measured. Low angle of view materials of this type typically do not exhibit Gaussian optical characteristics and the "see through" peak is ignored.

FIG. 2 shows microtomed sections of a diffuser, (produced by photopolymerisation of MCL 76 through an aperture optical mask as described above), under high magnification (the thickness of the photopolymer film is about 100 microns). Graded refractive index optical structures extending perpendicular to the major faces of the film are clearly visible.

Table 3 below sets out Angle of View data for diffusers manufactured as described above using the formulations and masks indicated in Table 1.

TABLE 3

Angle of View data

| Sample reference | Angle of View |
| --- | --- |
| MCL 70 | 23 |
| MCL 71 | 27 |
| MCL 76 | 16 |
| MCL 77 | 22 |
| MCL 78 | 13 |
| MCL 83 | 20 |

The above angle-of-view measurements were made using an Eldim "Conoscope" type EZ160R, whereas the measurements indicated in FIG. 1 were made using a different machine, and this may account for the differences in the values measured between FIG. 1 and Table 3 as regards MCL 76 and MCL 77.

Note: Sample MCL 83 was too small to measure accurately.

The Actilane 800 material and the Rahn 99-622 material referred to above, (and the Rahn 00-225 material referred to below), are prepolymers or macromonomers comprising molecules of significant molecular weight comprising a plurality of acrylic and siloxane groups, the molecules typically comprising an inorganic silicone backbone with pendant methyl groups. These materials, in the presence of free radicals, are able to undergo still further polymerisation. More particularly, these materials may comprise solutions of said prepolymers or macromonomers in further compatible monomers. The NVP, TMPTA and POEA referred to are ethylenically unsaturated monomers capable of polymerisation in the presence of free radicals. The Daracure 1173 (2-hydroxy-2-methyl-1-phenyl-1-propanone) is a photoinitiator capable of generating free radicals when exposed to UV light, to bring about polymerisation of the silicone acrylate materials and the ethylenically unsaturated monomers.

It may also be appropriate to incorporate an oxygen inhibitor or anti-oxidant in the formulation to improve shelf life and/or to minimise interference by atmospheric oxygen in the polymerisation of the material whilst it is exposed to atmosphere during exposure to UV light.

Whilst in the examples described above, the photopolymerisable material was exposed through an optical mask to produce the desired light diffusing sheets; the applicants have found that in certain conditions, at least some of the formulations noted, such as MCL 76 and MCL 77, will form a light diffusing layer when exposed to UV light even in the absence of an optical aperture mask of the kind described, eg. if the method described above is carried out except that the photopolymerisable material is coated directly onto a plain transparent glass plate instead of onto a photographic mask plate of the kind referred to.

Thus Tables 4, 5 and 6 below provide angle of view results for a number of different photopolymerisable mixtures or systems of various formulations and for two cases, namely (a) for exposure to collimated ultraviolet light through an aperture mask or screen, in the manner described with reference to Tables 1 to 3 above and (b) for exposure directly to collimated ultraviolet light distributed substantially uniformly over the plate or sample concerned, without any intervening photo mask, i.e. with the photopolymerisable material coated directly onto a plain transparent plate of glass or other transparent support. In each of the cases illustrated in Tables 4, 5 and 6, the ultraviolet light was directed normal to, i.e. perpendicular to, the plane of the glass plate or other transparent support. In cases (b), as indicated, the exposure time comprised two substantially equal periods of exposure, one from the glass side of the photopolymerisable layer/glass plate combination and one from the opposite side of said combination. For the cases (a) the exposure was selected in accordance with the density of the optical mask to achieve the optimum angle of view and the technique was in general as described above in relation to Tables 1 to 3.

In Tables 4 and 5, the numbers in the first horizontal row are identification numbers for the formulations concerned, and the numbers in the six horizontal rows below are the parts (by weight) in the respective formulation, of the components (e.g. Actilane 800; Daracure 1173; NVP; POEA; TMPTA and PVA) indicated in the column at the left of the table.

Figure 3:
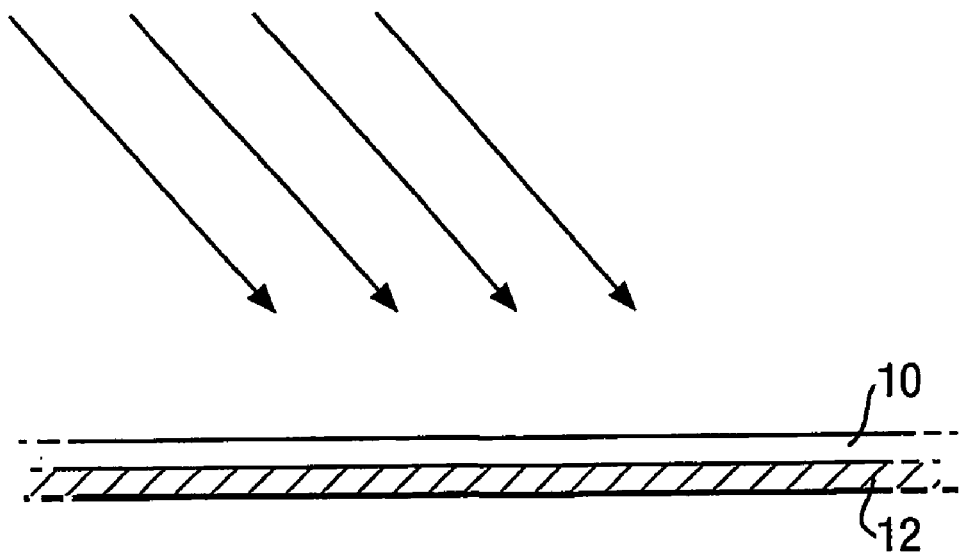
FIG. 3 is a schematic diagram, in vertical section through the photopolymer layer, illustrating one method of UV exposure in accordance with the invention.

The next three rows in each of Tables 4 and 5, below the heading "With Mask" set out, respectively, for those samples which were exposed through a mask as described in relation to FIGS. 1 to 3, the mask optical density used in the sample of the respective formulation indicated, the time, in minutes, of exposure to collimated ultraviolet light and the resulting angle of view (as defined above). The last two rows in each of Tables 4 to 6, below the heading "Without Mask", set out, for samples of the respective formulation exposed to collimated ultraviolet light without a mask, the total exposure time (in minutes) and the resulting angle of view (as defined above). In Tables 4 to 6, the angle of view indicated is the mean angle of view, effectively the mean of the angle of view measured in one arbitrarily selected plane containing the axis of the incident beam illuminating the sample and the angle of view measured in a plane, likewise containing the axis of said incident beam and perpendicular to said arbitrarily selected plane.

TABLE 4

Formulations - based on Actilane

| | Formulation | | | | | | | |
|---|---|---|---|---|---|---|---|---|
| | 98 | 101 | 104 | 107 | 110 | 119 | 121 | 122 |
| Actilane 800 | 60 | 60 | 60 | 60 | 60 | 75 | 60 | 60 |
| Daracure 1173 | 5 | 4 | 4 | 4 | 5 | 5 | 5 | 5 |
| NVP | 40 | 40 | 40 | 20 | 40 | 25 | 50 | 25 |
| POEA | 40 | 20 | 20 | 40 | 40 | 50 | 50 | 50 |
| TMPTA | 10 | 10 | 5 | 10 | 10 | 25 | 19 | 15 |
| PVA | 10 | 10 | 10 | 15 | 15 | 15 | 15 | 20 |
| With Mask | | | | | | | | |
| Mask Density | 1.25 | 1.94 | 1.14 | 1.14 | 1.14 | 1.91 | 1.25 | 1.91 |
| Exposure (mins) | 4 | 9 | 4 | 4 | 4 | 8 | 4 | 8 |
| AOV (degrees) | 33 | 24 | 22 | 41 | 30 | 32 | 37 | 39 |
| Without Mask | | | | | | | | |
| Exposure | 4 | 4 | 4 | 4 | 4 | 4 | 4 | 4 |
| AOV (degrees) | 27 | 25 | 35 | 36 | 29 | 35 | 24 | 35 |

TABLE 5

Formulations - based on Rahn

| | Formulation | | | | | | |
|---|---|---|---|---|---|---|---|
| | 99 | 102 | 105 | 108 | 111 | 125 | 127 |
| Rahn 99-622 | 60 | 60 | 60 | 60 | 60 | 75 | 60 |
| Daracure 1173 | 5 | 4 | 4 | 4 | 5 | 4 | 4 |
| NVP | 40 | 40 | 40 | 20 | 40 | 25 | 40 |
| TMPTA | 10 | 10 | 5 | 10 | 10 | 5 | 5 |
| PVA | 10 | 10 | 10 | 15 | 15 | 15 | 15 |
| With Mask | | | | | | | |
| Mask Density | 1.14 | 1.14 | 1.14 | 1.14 | 1.14 | 1.98 | 1.91 |
| Exposure (mins) | 4 | 4 | 4 | 4 | 4 | 9 | 8 |
| AOV (degrees) | 24 | 18 | 22 | 23 | 22 | 16 | 11 |
| Without Mask | | | | | | | |
| Exposure | 4 | 4 | 4 | 4 | 4 | 4 | 4 |
| AOV (degrees) | 1 | 1 | 1 | 1 | 2 | 15 | 2 |

Table 6 takes the same form as Tables 4 and 5 and illustrates corresponding results for formulations identified as 100 and 109, incorporating Crodamer UVS 500 resin (see below), instead of Actilane 800 or Rahn 99-622. Formulation 100 corresponded with formulation 98 (Table 4) but with the Actilane 800 replaced by Crodamer UVS 500 and likewise corresponded with formulation 99 (Table 5) but with the Rahn 99-622 material replaced by Crodamer UVS 500. Formulation 109 corresponded with formulation 107 (Table 4) but with the Actilane 800 replaced by Crodamer UVS 500, and corresponded with formulation 108 (Table 5) but with the Rahn 99-622 material replaced by Crodamer UVS 500. For ease of reference, in Table 6, the corresponding results for formulations 98 and 107 from Table 4, and for formulations 99 and 108 from Table 5, are also set out (the figures in the second horizontal row in Table 6 for formulations 98, 99, 107 and 108 have been replaced by the letters "A" or "R" as the case may be, to highlight the fact that the respective columns relate to samples of formulations with Actilane 800 or Rahn 99-622 respectively.

Crodamer UVS 500 is a silicone acrylate resin available from Croda Resins Limited of Kent, England.

TABLE 6

Formulations - based on Crodamer

| | Formulation | | | | | |
|---|---|---|---|---|---|---|
| | 100 | 98 | 99 | 109 | 107 | 108 |
| Crodamer UVS 500 | 60 | A | R | 60 | A | R |
| Daracure 1173 | 5 | 5 | 5 | 4 | 4 | 4 |
| NVP | 40 | 40 | 40 | 20 | 20 | 20 |
| POEA | 40 | 40 | 40 | 40 | 40 | 40 |
| TMPTA | 10 | 10 | 10 | 10 | 10 | 10 |
| PVA | 10 | 10 | 10 | 15 | 15 | 15 |
| With Mask | | | | | | |
| Mask Density | 1.98 | 1.25 | 1.14 | 1.14 | 1.14 | 1.14 |
| Exposure (mins) | 9 | 4 | 4 | 4 | 4 | 4 |
| AOV (degrees) | 10 | 33 | 24 | 11 | 41 | 23 |
| Without Mask | | | | | | |
| Exposure | 4 | 4 | 4 | 4 | 4 | 4 |
| AOV (degrees) | 1 | 27 | 1 | 1 | 36 | 1 |

It will be noted that the samples using Crodamer UVS 500 gave relatively low angles of view, even when exposed through optical masks, and negligible angles of view when exposed without a mask. The formulation using Rahn 99-622 (see also Table 5) likewise gave negligible or low angles of view when exposed without an optical mask, with the exception of formulation 125 which gave a 15 degree angle of view when exposed without a mask (and a 16 degree angle of view when exposed through a mask).

Figure 4:
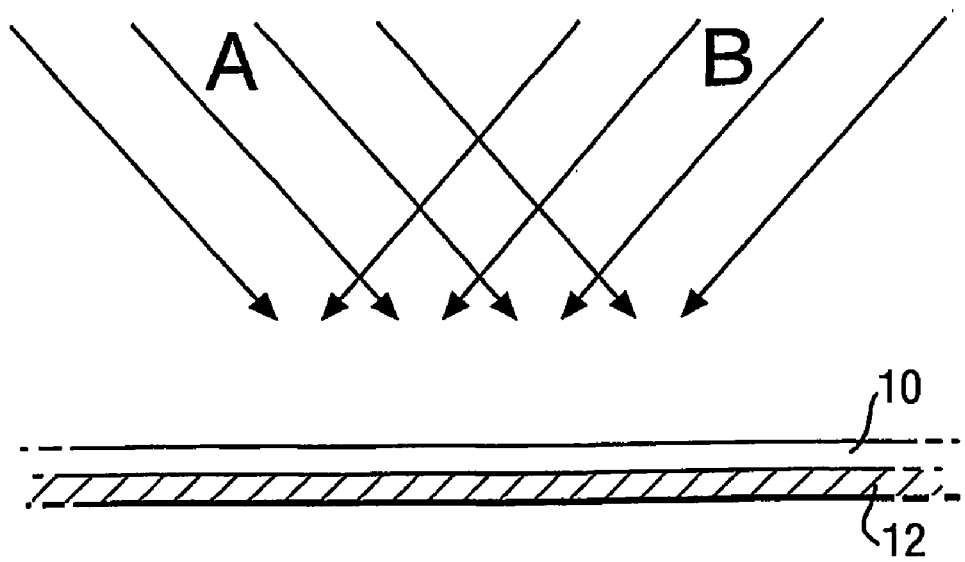
FIG. 4 is a diagram similar to FIG. 3 but illustrating another method in accordance with the invention.

As noted above, in the examples to which Tables 4 to 6 relate, the direction along which the collimated ultraviolet light was directed onto the photopolymerisable resin layer was normal to the major plane of that layer. However, it is possible, as illustrated in FIG. 4, to expose the photopolymerisable layer (referenced 10) to collimated light (indicated by the arrows) directed obliquely onto the photopolymerisable layer 10, (i.e. at an angle of greater than or less than 90° to the major plane of the layer). (Reference 12 in FIGS. 3 and 4 indicates the transparent, (e.g. glass) substrate on which layer 12 is supported). When the photopolymerisable layer is exposed to ultraviolet light in this manner, the resulting diffuser is found to exhibit asymmetric or anisotropic diffusion characteristics, for example, so that it behaves like a combination of an isotropic (Lambertian) diffuser and a thin prism. Likewise, as illustrated in FIG. 5, it is possible to expose the photopolymerisable layer 10 to two mutually inclined collimated light beams indicated by sets of arrows A and B each directed obliquely onto the layer 10 but inclined in opposite directions to the layer 10. By this means a diffusing sheet may be obtained which will spread light diffusively more in one direction than in an orthogonal direction, for example which will, if the light-diffusing sheet is set in a vertical plane perpendicular to an incident light beam, spread light diffusively more widely horizontally than vertically. That is to say the diffuser is asymmetrical in its diffusive effect. In general, exposure techniques may be, for example, as disclosed in EP-A-0768565, but omitting any optical masks referred to in that publication.

The term polymerisation as used herein, is intended to encompass processes by which homopolymers are formed as well as processes by which co-polymers are formed.

Figure 5A:
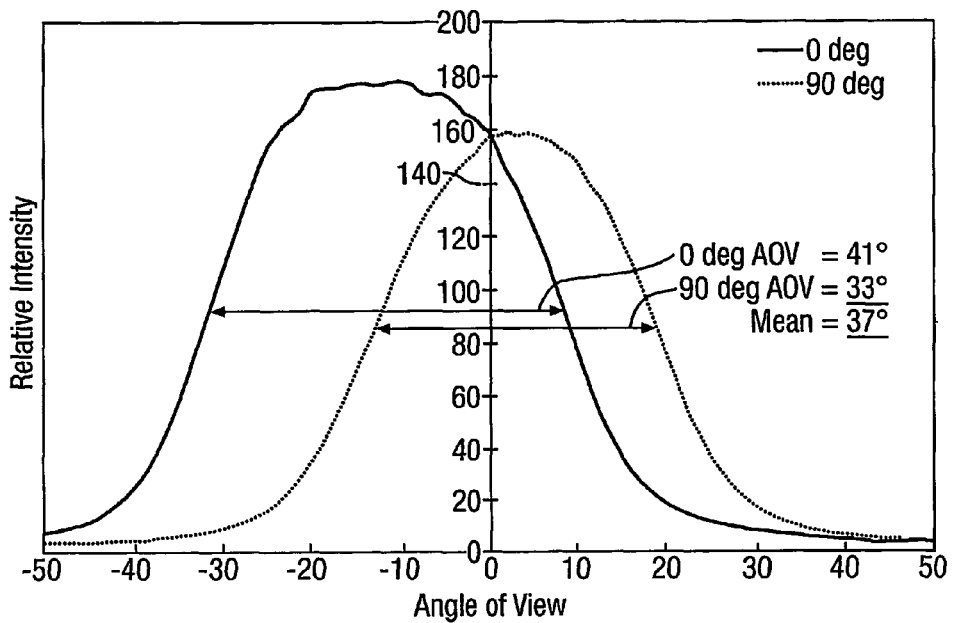
FIGS. 5A and 5B are angle-of-view graphs for sample diffusers.
Figure 5B:
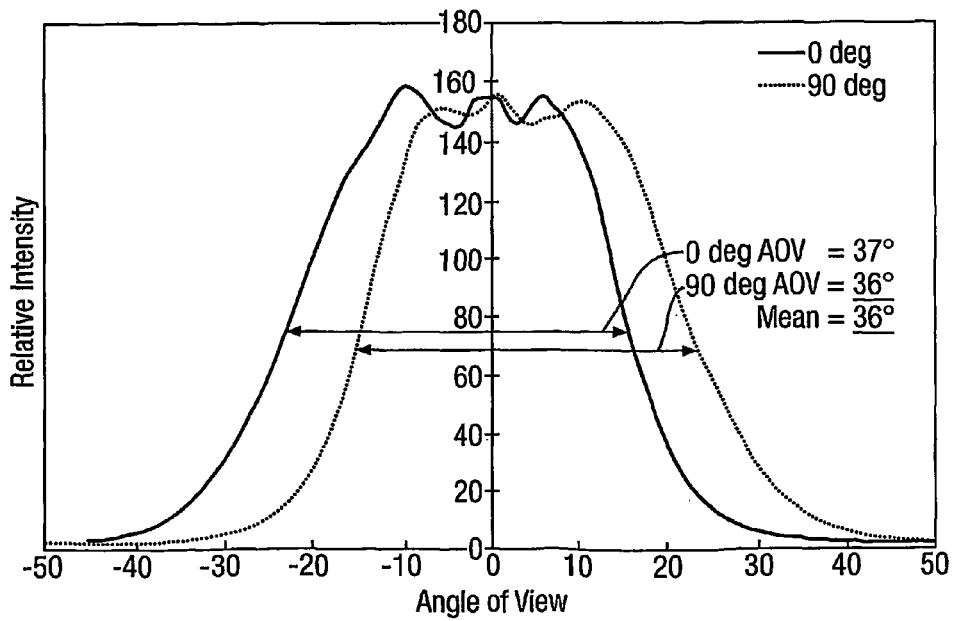

FIGS. 5A and 5B are angle-of-view graphs for samples produced from formulation 107, as described above respectively with an optical mask (FIG. 5A) and without any mask (FIG. 5B). Each of FIG. 5A and FIG. 5B comprises two plots, one (ref. "0 deg.") of relative intensity with angle in one plane including the axis of the beam incident on the sample and the other (ref. "90 deg.") of relative intensity with angle in a plane perpendicular to said one plane and including the axis of the beam incident on the sample. In each case, the incident beam was substantially normal to the plane of the sample. It will be noted that whilst the plots in FIG. 5B exhibit a slight irregularity in the region close to the 0 angle the general forms of the plots in FIGS. 5A and 5B are similar. It will also be noted that both the samples exhibit a degree of asymmetry or anisotropy, with the median of each of the two plots in each graph being displaced in opposite directions from the 0 axis. This demonstrates that, as with the diffusers produced using an optical mask, it is possible to produce asymmetrical or anisotropic diffusers in the manner indicated, without an optical mask. (It is assumed that, in production of the samples to which FIGS. 5A and 5B relate, the UV light may not have been directed precisely perpendicularly onto the photopolymerizable layer.)

In what follows, some examples are given of the manufacture of holograms using photopolymerisable materials of the same kind as disclosed above, or of similar kinds. In the manufacture of these holograms, the photopolymerisable materials may be exposed directly to photopolymerising coherent radiation using the photopolymerisable material to record a holographic image directly and produce a volume or phase hologram. (For reproduction of similar holograms, of course, a hologram may first be recorded, in coherent light, on a photographic film or plate which is subsequently developed and used as a mask through which a layer of such photopolymer is exposed to polymerising radiation in substantially the same way as described above for the manufacture of a diffuser using a mask, but the result is not a true volume hologram and, of course, the latter method would involve an additional, and generally unnecessary method step).

Figure 6:
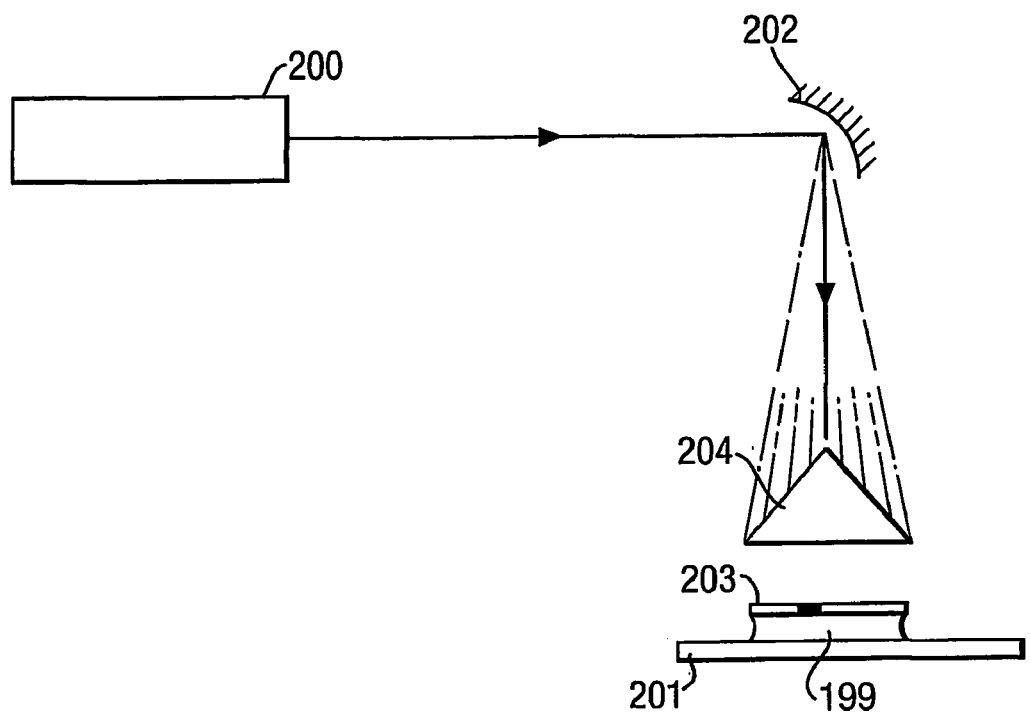
FIG. 6 is a schematic diagram of an apparatus used for forming holograms for text purposes in some of the examples herein.

In tests to assess the suitability of the photopolymerisable materials or systems concerned as holographic materials, the apparatus shown in FIG. 6 and as described below was used. Thus, an argon laser 200 was set up as shown in FIG. 6 to enable samples of photopolymer to be exposed to UV light. The laser operated at about 350 nm at an output power of 300 mwatt To produce the hologram samples, a drop of photopolymer material 199 was placed on a microscope slide 201 then covered with a circular cover slide 203 about 23 mm in diameter. This produced samples between 30 and 70 microns thick. Light from the laser 200 was directed onto a concave mirror 202 and directed therefrom, as an expanding beam, onto a glass prism 204 arranged as indicated. Thus the prism had the form of an isosceles triangle with its based parallel with and directly above the slide 201/layer199/cover 203 sandwich and with the prism located centrally in the laser beam from mirror 202 (which beam was directed substantially along the normal to the planes of the interfaces between the layer 199 and the microscope slide and cover slip. The use of the prism 204, as shown in the sketch, produced an interference pattern (hologram) within the photopolymer and the energy in the UV light caused the photopolymer to polymerise to a solid film. The exposure time was typically 30 seconds and increasing the exposure to 120 seconds did not appear to affect the quality of the hologram. The hologram could be replayed by using sunlight or a similar bright source. The formulations evaluated are set out in Tables 7 and 8 below.

In Tables 7 and 8 below, the components of each formulation or system are set out in the second to sixth row in the column which is furthest to the left, whilst the first row in each table carries a series of numerical identifiers or codes, each representing a particular formulation or system. The column directly below each such identifier or code sets out, in the second to sixth row, the proportions, in the respective formulation or system, of the respective component in the same row in the column which is furthest to the left.

Variant systems may include PVA and a compatible organic solvent. A further option would be to use poly(vinyl formal) or poly(vinyl butyral) (PVB) to improve refractive index modulation.

With the method described above, all holograms produced were of a similar quality. Exposure with S polarisation was slightly superior to P polarisation. Some holograms were heated, after exposure, in an oven at 90 C. for two hours. This also slightly enhanced the brightness of the hologram.

Also for purposes of comparison, similarly prepared samples of the materials set out in Table 7 and Table 8 were exposed to polymerising radiation through aperture masks, as described above and corresponding samples were exposed to polymerising radiation without using aperture masks. Tables 7 and 8 show in the penultimate row in the table (AOV mask) the angle of view of the diffuser resulting from such exposure of the respective material samples through such an aperture mask and in the last row (No mask) the angle of view of the diffuser resulting from such exposure of the respective material samples directly, without such a mask.

TABLE 7

| | Formulation | | | | | | |
|---|---|---|---|---|---|---|---|
| | 146 | 147 | 150 | 153 | 185 | 187 | 176 |
| RAHN 00-225 | 60 | 60 | 60 | 60 | 75 | 75 | RAHN (99-622) 75 |
| Daracure | 4 | 4 | 4 | 5 | 3 | 4 | 3 |
| NVP | 20 | 20 | 40 | 40 | | | |
| POEA | 40 | 40 | 40 | 40 | 40 | 40 | 25 |
| TMPTA | 10 | 10 | 5 | 10 | | | |
| PVA | 10 | 15 | 15 | 15 | 10 | 10 | 25 |
| Hologram | | | | | | | |
| AOV mask | 30 | 30 | 23 | 28 | 34 | 23 | 5 |
| No mask | 34 | 32 | 35 | 25 | 36 | 37 | 20 |

TABLE 8

| | FORMULATION | | | | | | |
|---|---|---|---|---|---|---|---|
| | 101 | 177 | 178 | 179 | 180 | 181 | 182 |
| Actilane 800 | 60 | 60 | 60 | 60 | 60 | 60 | 60 |
| Daracure | 4 | 4 | 4 | 4 | 4 | 4 | 5 |
| NVP | 40 | 0 | 20 | 20 | 20 | 20 | 20 |
| POEA | 20 | 40 | 30 | 30 | 30 | 40 | 40 |
| TMPA | 10 | 10 | 10 | 20 | 30 | 20 | 30 |
| PVA | 10 | 20 | 15 | 15 | 15 | 15 | 15 |
| Hologram | | | | | | | |
| AOV mask | 25 | 33 | 30 | 35 | 31 | 34 | 34 |
| No mask | 23 | 32 | 35 | 31 | 28 | 23 | 26 |

Controls

For purposes of comparison, the same procedure, using the same apparatus (FIG. 6) was applied to control samples which comprised only silicone acrylate resin plus photoinitiator. For these control samples also, equivalent samples were used to prepare diffusers, with and without masks. Corresponding results for these controls are shown in Table 9 below. The techniques used for generating a diffuser with and without a mask and to create a hologram were as described above in relation to Table 7 and Table 8.

TABLE 9

| | FORMULATION | | |
|---|---|---|---|
| | 211 Actilane 800 | 212 Rahn 00-225 | 213 Rahn 99-622 |
| Diffuser prepared using mask | AOV = 11° | Haze | Weak diffuser AOV <4° |
| Diffuser prepared without mask | Evidence of structure | Weak diffuser AOV <3° | Haze |
| Hologram | Yes | Yes, but hazy | Yes |

Formulations 211, 212 and 213 are respectively 100 pts of the respective above resin indicated in Table C plus three parts of photoinitiator (Daracure 1173). In relation to the references to "haze" in Table 9 it should be noted that with very weak diffusers it is possible to differentiate between such haze and the diffusing characteristics of a diffuser with light guiding structures by observing off-axis transmission. Haze increases with the extent to which the incident radiation is off-axis as compared with on axis because haze is thickness dependent. Materials incorporating light guiding structures become more transparent off-axis.

The silicone acrylate resins used were: Actilane 800, Rahn 00-225 and Rahn 99-622. Rahn 99-622 contains the same resin as Rahn 00-225 but has been diluted with polyether polyol tetra acrylate (PPTTA) in the ratio of 30:70. (PPTTA:Rahn 00-225). Rahn 00-225 is very viscous, more viscous than Actilane 800 and apparent of higher MW.

PVA may be added to Actilane 800 as in Table 8. The use of a cross-linker such as TMPTA with the Actilane 800 as in Table 8 or with Rahn 00-225 as in Table 7 encourages volume graded refractive index effects, i.e. the refractive index varies from position to position within the photopolymer material. The addition of PVA does not change this result.

As shown in Tables 7, 8 and 9 above, silicone acrylate resins have the ability to form diffusers when an aperture mask is used and to some extent without, provided the viscosity is sufficiently low to allow diffusion during the exposure process. The presence of the PPTTA monomer in MCL 213 illustrates this and the difference between 211 and 213 suggests the importance of molecular weight (MW). From these results it can be seen that the combination of silicone (or siloxane) resin and acrylic (or methacrylate) monomer in appropriate proportions could be used to create both diffusers and holograms.

It should be understood that in many cases, for example, where a holographic recording material is to be supplied to end users, the recording material may comprise a product in the form of the photopolymerisable system or formulation in accordance with the invention sandwiched between a relatively inert and ideally transparent sheet, for example, sandwiched between two sheets of Mylar (polyester) film. Such a product may be made, for example, by modifying the formulations indicated in Table 7 and Table 8 by increasing the proportion of PVA and including a compatible solvent for the PVA (such as MEK), to provide a formulation of a viscosity low enough to allow it to be readily applied as a coating, and coating the fluid system onto one Mylar film in a coating apparatus, known per se, for applying a coating of uniform thickness, the second Mylar film subsequently being applied to the exposed surface of the photopolymerisable layer after removal of excess solvent from the coating.

Figure 7:
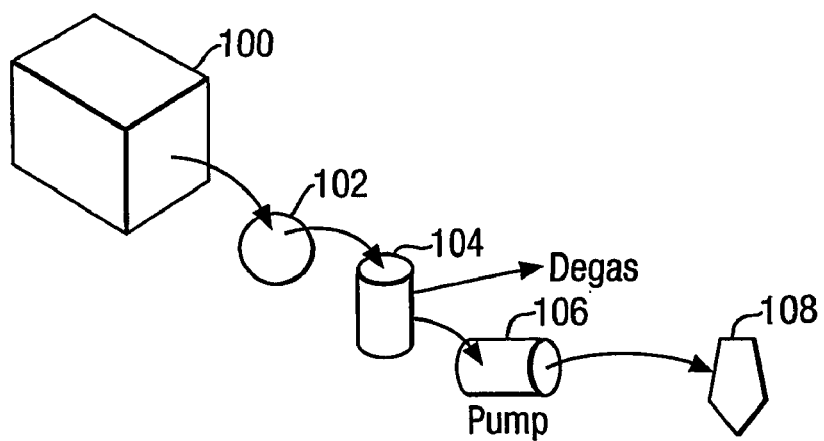
FIG. 7 is a schematic diagram illustrating the organisation of a commercial production line utilising the invention.
Figure 8:
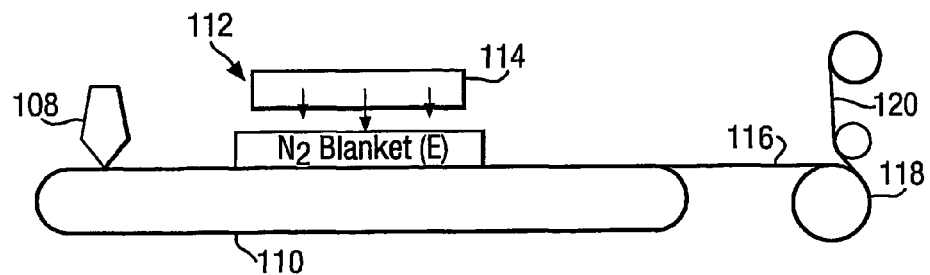
FIGS. 8, 9 and 10 illustrate schematically different forms of coater arrangement which may be used in the final stage of the production line of FIG. 7 and, FIG. 11 shows structural chemical formulae for various materials referred to in the description below.
Figure 9:
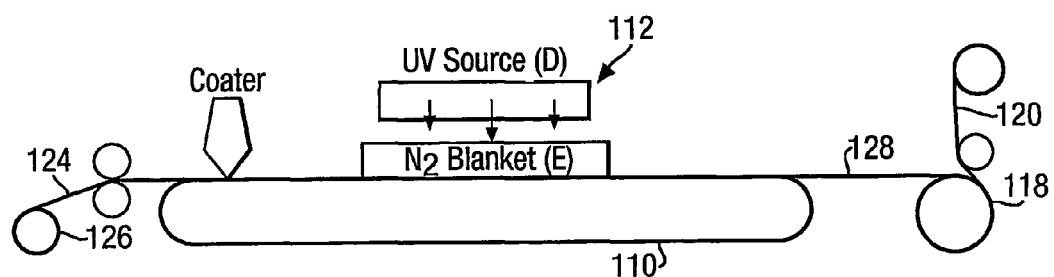
Figure 10:
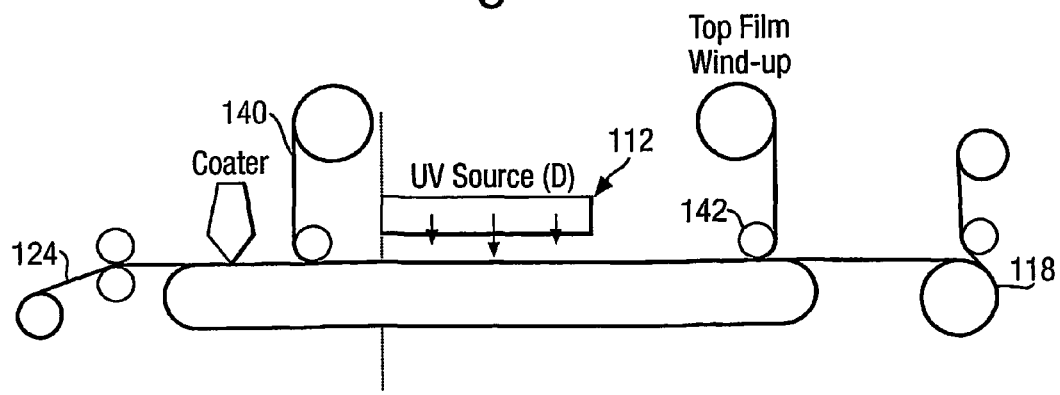

Apparatus suitable for the commercial production of optical diffusers from the materials of the invention is shown schematically in FIGS. 7 to 9. For the production of holograms, the collimated UV source necessary for diffusers would be replaced by a suitable laser imaging system to produce the required interference pattern within the photopolymer film. FIG. 7 illustrates schematically a production line for holographic material (or material for producing diffusers) of the kinds referred to herein. Thus, the individual components of the photopolymerisable system are supplied from bulk storage 100 by suitable metering means 102, (ensuring the correct proportions of the components), to a mixing facility 104, known per se, from whence the mixture is pumped by a pump to a coater 108. FIGS. 8, 9 and 10 illustrate schematically different coater arrangements may be used.

For example, in FIG. 8, an endless flexible web or conveyor belt 110 is coated directly, on its upper rub, with the photopolymerisable mixture by coater 108 and carries the coating thereon to an exposure station 112 where a nitrogen blanket is maintained over the coating once it is exposed to, for example, coherent UV light from source 114, forming a holographic image, (or such as to form an optical diffuser), and after the resulting polymerisation and curing, the polymerised material, now forming a solid flexible, self-supporting film 116, is stripped from the conveyor and wound up on a take-up reel 118, with a protective film 120 which lies between successive turns of the polymerised product.

The arrangement of FIG. 9 differs from that of FIG. 8 in that the photopolymerisable material is coated onto a polyester film 124 drawn from a reel 126 and supported by the conveyor, the coated polyester film 128 being wound up on a take-up reel 118 with a protective film 120 being again interleaved between successive turns of the product on the take-up reel.

The arrangement of FIG. 10 corresponds with that of FIG. 9 except that, directly after coating the polyester film on the conveyor, and before exposure, a further transparent film 140, (which may also be polyester), is applied on top of the coating. As, in this arrangement, the further film 140 on top of the coating serves to exclude air from the photopolymerisable coating, no nitrogen gas blanket needs to be employed. After the substrate/coating/top film "sandwich" has passed the exposure station 112 and the coating has thereby been polymerised to form a solid flexible film, the top film 140 is peeled off from the photopolymer around a roller 142 and the product is wound onto a take-up reel 118. (It may be possible to re-use the top film 140). The substrate 124, with the cured coating thereon, is then wound onto a take-up reel as before, with an interleaved protective layer. Substantially the same arrangements can be used whether the end product comprises phase holograms or optical diffusers.

Further examples illustrating the production of optical diffusers using silicone-based materials in accordance with the invention are set out below. In these examples, test samples were prepared either using a commercially available laminator or using the "screen printing technique" described above.

In the following, Section A and Section B respectively set out results for tests conducted using the formulations indicated (where the nature of the materials Rahn 99-622, Actilane 800, Daracure 1173 etc. were as set out earlier in this specification).

In Sections A and B below, the first row in each table, referenced MCL in the left hand column, carries, as headings, identification numbers for each formulation, to which the column below relates. In section A, the next nine rows, and in section B, the next four rows, set out the proportions, in the respective formulation of the respective components identified in the column furthest to the left.

The last row in each table sets out the angle of view in each of two orhthogonal directions for the respective example exposed without an optical mask; the second from last row in each table sets out the exposure time for each sample, both for the example exposed without a mask and for the example exposed through a mask and for which the angles of view in each of two orthogonal directions are set out in the third from last row.

In section A below, the samples referred to were prepared on the laminator, except for those indicated as having been exposed through an optical mask, which were prepared by hand using the screen printing technique with a template of known thickness (100-150 microns).

The samples in Section A were UV-cured on an apparatus termed, for convenience, the 'Elephant' (which has an ultra-violet source which produces well collimated UV light.) at 650 w @4.5 min/m for formulations MCL 176, 208, 295 and 1000 W for formulation MCL 188.

Section A

| | MCL | | | |
|---|---|---|---|---|
| | 176 | 188 | 208 | 295 |
| Actilane 800 | — | 100 | 25 | 100 |
| Rahn 99-622 | 75 | — | — | — |
| Rahn 00-25 | — | — | 75 | — |
| Daracure 1173 | 3 | 5 | 6 | 2.1 |
| NVP | — | — | — | 33 |
| ACMO | — | 5 | — | 67 |
| POEA | 25 | — | 67 | — |
| TMPTA | — | — | 17 | 10 |
| PVA | 25 | — | — | 10 |
| AoV (Mask) | 20.9/18.1 | 36.5/38.7, 39.7/35 | 39/41.1 | 32.2/33.1 |
| Exposure time (Mask OD) | 3 min × 2 (1.20) | 3 min × 2 (1.33) | 3 min × 2 (1.53) | 3 min × 2 (1.62) |
| AoV (No Mask) | 21.9/21.6 | 20.9/16.5, 15.7/14.6 | 33/33.7 | 23.7/23.2 |

In Section B below, the samples were prepared by hand using the screen printing technique referred to above with a template of known thickness (100-150 microns on a glass plate or photographic plate/mask then UV-cured on the 'Elephant'.

Section B

| | MCL | | |
|---|---|---|---|
| | 211 | 212 | 213 |
| Actilane 800 | 100 | — | — |
| Rahn 99-622 | — | — | 100 |
| Rahn 00-25 | — | 100 | — |
| Daracure 1173 | 3 | 3 | 3 |
| AoV (Mask) | 10.2/11.9 | 1.4/1.2 | 3.5/3.4 |
| Exposure time (Mask OD) | 2 min × 2 (1.15) | 2 min × 2 (1.1.5) | 2 min × 2 (1.15) |

-continued

| | MCL | | |
|---|---|---|---|
| | 211 | 212 | 213 |
| AoV (No Mask) | 1.4/1.4, 1.2/1.2, 2.6/2.2, 7.5/7.6 | 1.1/1.3, 7.5/7.6 | 2.1/3, 27.2/18.9 |

Rahn 99-622 is a combination of Rahn 00-225 (30%) and PPTTA (70%). The chemical PPTTA, tradename Genomer 1456 is polyetherpolyoltetraacrylate Further useful formulations utilising simply a silicone acrylate and a photoinitiator are set out below in Table 10 together with angle of view (AoV) of the resulting diffuser after a 'standard' exposure to UV, for exposure through an optical aperture mask of the density indicated in in the column headed 'Mask OD' (or, where indicated, direct exposure to collimated UV light without a mask.

TABLE 10

| Formulation | Components | Ratio | Mask OD (Cure time) | AoV |
|---|---|---|---|---|
| MCL 312 | Polysiloxane hexaacrylate Tradename = Ebecryl 1360 | 100 | No mask, Glass only | 19 |
| | Duracure 1173 | 3 | 1.33 (2 × 3 min) | 21 |
| MCL 313 | Silicone diacrylate Tradename = Ebecryl 350 | 100 | No mask or glass, mylar on mylar | 11 |
| | Daracure 1173 | 3 | | |
| MCL 314 | Siliconized urethane acrylate oligomer Tradename = CN 990 | 100 | No mask, Glass only | Clear film |
| | Daracure 1173 | 3 | 1.56 (2 × 3 min) | Clear film |
| MCL 340 | Perenol S71 UV | 100 | No mask, Glass only | 1.2 |
| | Daracure 1173 | 3 | 1.23–1.27 (2 × 3 min) | 7 |

Ebecryl 1360 and 350 are from UCB Chemicals Limited
CN 990 is from Sartomer
Perenol S71 UV is from Cognis Further useful formulations using a silicone acrylate and an unsaturated monomer are set out below, in Table 11, with the results indicated.

TABLE 11

| Formulation | Components | Ratio | Mask OD (Cure time) | AoV |
|---|---|---|---|---|
| MCL 176 | Rahn 99-622 | 75 | No mask, glass only | 22 |
| | Daracure 11723 | 3 | 1.53 | 37 |
| | POEA | 25 | (2 × 3 min) | |
| | PVA | 25 | | |
| MCL 300 | Ebecryl 1360 | 75 | No mask, glass only | 25 |
| | Daracure 1173 | 3 | 1.64 | 34 |
| | POEA | 25 | (2 × 3 1/2 min) | |
| | PVA | 25 | | |
| MCL 303 | Ebecryl 350 | 75 | No mask, glass only | 25 |
| | Daracure 1173 | 3 | 1.64 | 25 |
| | POEA | 25 | (2 × 3 1/2 min) | |
| | PVA | 25 | | |
| MCL 306 | CN 990 | 75 | No mask, glass only | 22 |
| | Daracure 1173 | 3 | 1.64 | 34 |
| | POEA | 25 | (2 × 3 1/2 min) | |
| | PVA | 25 | | |
| MCL 338 | Perenol S71 UV | 75 | No mask, glass only | 34 |
| | Daracure 1173 | 3 | 1.64 | 34 |

TABLE 11-continued

| Formulation | Components | Ratio | Mask OD (Cure time) | AoV |
|---|---|---|---|---|
| | POEA | 25 | (2 × 3 1/2 min) | |
| | PVA | 25 | | |
| MCL 252 | Actilane 800 | 45 | No mask, glass only | 34 |
| | Rahn 99-622 | 15 | 1.53 | 44 |
| | Daracure 1173 | 1.7 | (2 × 3 min) | |
| | NVP | 20 | | |
| | POEA | 40 | | |
| | TMPTA | 10 | | |
| | PVA | 15 | | |
| MCL 302 | Ebecryl 1360 | 45 | No mask, glass only | 39 |
| | Rahn 99-622 | 15 | 1.64 | 56 |
| | Daracure 1173 | 1.7 | (2 × 3 1/2 min) | |
| | NVP | 20 | | |
| | POEA | 40 | | |
| | TMPTA | 10 | | |
| | PVA | 15 | | |
| MCL 304 | Actilane 800 | 45 | No mask, glass only | 38 |
| | Ebecryl 350 | 15 | 1.64 | 40 |
| | Daracure 1173 | 1.7 | (2 × 3 1/2 min) | |
| | NVP | 20 | | |
| | POEA | 40 | | |
| | TMPTA | 10 | | |
| | PVA | 15 | | |
| MCL 307 | Actilane 800 | 45 | No mask, glass only | 38 |
| | CN 990 | 15 | 1.64 | 40 |
| | Daracure 1173 | 1.7 | (2 × 3 1/2 min) | |
| | NVP | 20 | | |
| | POEA | 40 | | |
| | TMPTA | 10 | | |
| | PVA | 15 | | |
| MCL 339 | Actilane 800 | 45 | No mask, glass only | 41 |
| | Perenol S71 UV | 15 | 1.23–1.27 | 45 |
| | Darcure 1173 | 1.7 | (2 × 3 min) | |
| | NVP | 20 | | |
| | POEA | 40 | | |
| | TMPTA | 10 | | |
| | PVA | 15 | | |

Useful formulations incorporating acryloyl morpholine (ACMO) as the unsaturated monomer, are set out below, in Table 12 together with the results. (It will be understood that the table below and the two preceding tables are, apart from the components of the formulations listed, the ratios of the components in the formulations and the numerical values indicated, substantially the same, so that the headings and layout, etc. are the same in each table).

TABLE 12

| Formulation | Components | Ratio | Mask OD (Cure time) | AoV |
|---|---|---|---|---|
| MCL 321 | Actilane 800 | 60 | No mask glass only | 35 |
| | Daracure 1173 | 4 | | |
| | ACMO | 20 | | |
| | POEA | 40 | | |
| | TMPTA | 10 | | |
| | PVA | 15 | | |
| | | | 1.44 (2 × 3 min) | 38 |
| MCL 322 | Actilane 800 | 45 | No mask, glass only | 32 |
| | Rahn 99-622 | 15 | | |
| | Daracure 1173 | 1.7 | 1.88 | 36 |
| | ACMO | 20 | (2 × 4 min) | |
| | POEA | 40 | | |
| | TMPTA | 10 | | |
| | PVA | 15 | | |

The formulations described above are more or less viscous liquids in the unpolymerised state and form, upon polymerisation, solid flexible films which can, if desired, be peeled off their respective substrates and/or cover sheets.

Alternatives to silicone acrylate prepolymers as described above include siloxane and acrylic monomers and prepolymers incorporated as separate components and the acrylate components replaced by methacrylates or acrylamides or other reactive species such as epoxies or polyesters and incorporating the appropriate polymerisation initiators.

As noted above, at least some of the formulations referred to will form a light diffusing layer when exposed to UV light even in the absence of an optical aperture mask. It now seems that this effect may be to some extent conditional by the thickness of the photopolymer layer, dependent, in turn, inter alia, upon the viscosity of the material. In general, thinner layers, e.g. formed from a material with a higher proportion of monomer, tend to be better holographic recording materials, whilst thicker layers tend to be better for forming diffusers.

The applicants have found that the thickness of the photopolymorisable layer exposed to form a diffuser in the manner described is of some importance, insofar as they have found that, below a certain thickness, a given formulation, at least where exposed without a mask, fails to form a diffuser. This critical thickness, it has been found, is different for different formulations. Furthermore the applicants have noted that increases in thickness alter the light diffusing properties of the diffuser produced little, or not at all. With these factors in mind, it is possible by a few simple tests to establish the optimum thickness for each system formulation.

The applicants have found that for diffusers of significant strength, it is necessary for the silicone content of the photopolymerisable formulation used to be within certain ranges In this specification, the silicone content is calculated as the weight, in the total formulation of the

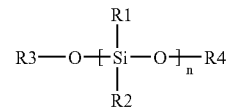

in a given quantity of the formulation divided by the total weight of the reactive component in that given quantity of the formulation, expressed as a percentage. The applicants have found that, for most applications, the silicone content of the formulation, on this basis, should be between 15 and 90%, preferably between 25 and 80% and most preferably between 30 and 60% of the reactive components.

As discussed herein, to form optical diffusers by exposure of the photopolymerisable systems referred to by exposure to polymerising radiation, such as UV light, without the use of an optical mask, the light or other radiation used should be collimated, i.e. substantially parallel. The applicants have found, however, that useful diffusers can be produced using UV light which is less than perfectly collimated, e.g. such that, for example, a major percentage of the light directed onto any given infinitesimal area of the material being exposed passes within a small angle $\alpha$ of a nominal direction (which nominal direction may be, for example, normal to the plane of the exposed layer, where a is preferably less than 10°, more preferably less than 5°, although for some applications it may be necessary for a to be less than 1°. The following examples, set out in Table 13 below, illustrate the relevance of the degree of collimation.

In the following the 'Elephant' as noted above, is an apparatus for exposing photopolymerisable samples prepared as described herein and which directs a closely collimated beam of UV light (within 1° of perfect parallelism) onto the sample. The 'Natgraph' (UV source where the degree of collimation can be varied) is an apparatus for the same purpose which provides light collimated only to within 5° of perfect parallelism. Table 13 illustrates the significance of the degree of collimation afforded by these two apparatuses.

TABLE 13

Non-collimated versus collimated light

| Formulation | NATGRAPH | | | ELEPHANT | | |
| --- | --- | --- | --- | --- | --- | --- |
| | 107 | 208 | 293 | 107 | 208 | 293 |
| Appearance of liquid before UV-cure | Cloudy/ Opaque Clear | Clear | Clear | Cloudy/ Opaque Clear | Clear | Cloudy/ Opaque Clear |
| | Viscous | Not so viscous | Not so viscous | Viscous | Not so viscous | Not so viscous |
| | No Undissolved material | No Undissolved material | No Undissolved material | No Undissolved material | No Undissolved material | No Undissolved material |
| Adherence of film | Glass | Glass | Glass | Mylar | Glass | Mylar |
| Quality of diffuser by eye | Good Diffuser | Weak Diffuser | Good Diffuser | Good Patchy Diffuser | Good Patchy Diffuser | Good Patchy Diffuser |
| Film off-axis | Did not clear when twisted | Clear when twisted | Did not clear when twisted | Did not clear when twisted | Did not clear when twisted | Did not clear when twisted |
| Film thickness/μm | 125–162 | 102–135 | 132–159 | 100–153 | 108–135 | 144–202 |
| Flexibility of film | Flexible | Flexible | Flexible | Flexible | Flexible | Flexible |
| AoV (Eldim) | 26.9 | 11.8 | 7.0/7.5 | 34.6/35.1 | 31.6/32.8 | 37.3/38.6 |

TABLE 13-continued

Non-collimated versus collimated light

|  | NATGRAPH | | | ELEPHANT | | |
| --- | --- | --- | --- | --- | --- | --- |
| Formulation | 107 | 208 | 293 | 107 | 208 | 293 |
| Cross-section | columns | columns | columns | Columns | columns | Columns |
| Exposure time/min | 1 | 1 | 1 | 1 | 1 | 1 |
| Electrical power input/W | — | — | — | 700 | 700 | 700 |

The applicants have found that optical diffusers manufactured in accordance with the invention have, in many cases, the curious property that if viewed at an angle significantly displaced from the original angle of incidence of the polymerising radiation on the precursor material the diffuser appears substantially clear transparent whilst if viewed in a direction aligned with the direction of incidence of the original polymerising radiation on the precursor material, the diffuser appears as a normal light diffuser. The references in the table above to "clear when twisted" referred to this phenomenon. appears as a normal light diffuser. The references in the table above to "clear when twisted" referred to this phenomenon.

The materials disclosed above may be used, inter alia, in the manufacture of holograms, microlens arrays, and of light-diffusing or depixelating screens by the techniques disclosed above.

Diffusers made using the materials of the invention, by the above-described methods in accordance with the invention, have the useful property of being polarisation maintaining, and, indeed have polarisation maintenance typically better than 97%. That is to say, if, for example, light passing through such a diffuser is 100% plane polarised with a particular direction of polarisation before reaching the diffuser, 97% or more of the light emerging from the diffuser will still be plane polarised in the same direction. This has significant implications for the use of such diffusers in conjunction with LCD displays, for example, which rely upon control of polarisation of light to produce visible text and graphics Using the silicone-based photopolymerisable materials discussed above, it is readily possible to produce optical diffusers, by either the mask exposure method or the maskless exposure method discussed above, which have better than 99% polarisation maintenance. Up until the date of the present invention, optical diffusers produced by exposure of commercially available photopolymers through optical aperture masks have, at best, had around 97% polarisation maintenance. Furthermore, (and without sacrificing the excellent polarisation maintenance), optical diffusers may be produced using the silicone based materials of the invention (and again by either the mask exposure method or the maskless exposure method), having an angle of view as high as 56 degrees, whereas the greatest angle of view that has until now be achievable by exposure of commercially available photopolymers through optical masks, (necessary to achieve a diffuser in the case of such commercially available photopolymers), has been around 35 degrees, where surface relief effects have been removed or avoided, or 40 degrees taking advantage of surface relief effects. (In the case of optical diffusers manufactured in accordance with the present invention, the angle of view of up to 56 degrees is achievable without relying upon surface relief effects, i.e. by relying wholly upon refractive index variations within the volume of the diffuser material).

These significant differences with diffusers manufactured in accordance with the present invention, as compared with the prior art, have significant implications for diffusers used in conjunction with LCD displays, for example.

The term polymerisation as used herein, is intended to encompass processes by which homopolymers are formed as well as processes by which co-polymers are formed.

In the present specification "comprises" means "includes or consists of" and "comprising" means "including or consisting of".

The invention claimed is:

1. A solid, light-transmitting diffuser having volume refractive index variations or surface relief features that are produced by the exposure of a free radical photopolymerizable system to non-coherent, substantially collimated polymerizing electromagnetic radiation, wherein the system includes a monomer, prepolymer, macromonomer or co-monomer comprising silicone groups wherein the silicone monomer, macromonomer, co-monomer or prepolymer comprises silicone acrylate, acrylate terminated poly(dimethylsiloxane), multifunctional silicone acrylate or silicone acrylamide.

2. The diffuser of claim 1, which exhibits polarization maintenance higher than 97%.

3. The diffuser of claim 1 wherein at least one component of the system incorporates ethylenic unsaturation such that the system is fully polymerized by free radical initiated polymerization.

4. The diffuser according to claim 1 wherein the silicone monomer, macromonomer, co-monomer or prepolymer comprises a difunctional silicone acrylate.

5. The diffuser according to claim 1 in which the silicone monomer, macromonomer, co-monomer or prepolymer is a substituted multifunctional silicone acrylate.

6. The diffuser according to claim 5 in which the substituted multifunctional silicone acrylate is an urethane acrylate.

7. The diffuser according to claim 1 wherein the system incorporates further compatible polymer(s) and/or monomer(s).

8. The diffuser according to claim 7 in which one or more of the additional compatible components has a refractive index different to the polymerizable silicone comprising component.

9. The diffuser according to claim 7 in which the compatible polymer or polymers includes polyvinyl acetate, polymethyl methacrylate or silicone gum materials.

10. The diffuser according to claim 7 in which the compatible monomer or monomers are unsaturated organic compounds.

11. The diffuser according to claim 10 in which the unsaturated organic compounds are multifunctional.

12. The diffuser according to claim 10 in which the unsaturated organic compounds are monomers which include acrylate, methacrylate, epoxy or ethylenic groups.

13. The diffuser according to claim 10 wherein the system incorporates a compatible polar organic solvent.

14. The diffuser according to claim 13 in which the polar organic solvent is methyl ethyl ketone.

15. The diffuser according to claim 1 in which the polymerizing radiation is UV light.

16. The diffuser according to claim 15 wherein the system incorporates UV photoinitiator(s) to facilitate polymerization.

17. The diffuser according to claim 16 in which the photoinitiator is selected from the group consisting of:
  a) Methyl benzoyl formate
  b) 1-Hydroxycyclohexyl phenylketone
  c) 2-Hydroxy-2-methyl-1-phenyl-1-propanone
  d) Diphenyl(2,4,6-trimethylbenzoyl)phosphine oxide
  e) 2,4-Diethylthioxanthone plus suitable amine synergist and mixtures of two or more of the above.

18. The diffuser according to claim 1 in which the silicone content comprises 15-90% of the components.

19. The diffuser according to claim 1 in which the silicone content comprises 25-80% of the components.

20. The diffuser according to claim 1 in which the silicone content comprises 30-60% of the components.

21. The diffuser of claim 1 which exhibits polarization maintenance higher than 99%.

22. The diffuser of claim 1 which has an angle of view in excess of 40 degrees.

23. The diffuser of claim 22 in which said angle of view is provided without relying upon surface relief.

24. The diffuser of claim 1 which has an angle of view in excess of 50 degrees.

* * * * *

UNITED STATES PATENT AND TRADEMARK OFFICE
CERTIFICATE OF CORRECTION

PATENT NO. : 7,232,651 B2  Page 1 of 1
APPLICATION NO. : 10/416397
DATED : June 19, 2007
INVENTOR(S) : Clabburn et al.

It is certified that error appears in the above-identified patent and that said Letters Patent is hereby corrected as shown below:

Column 4, line 34, "Oxygen Bitors" should read -- Oxygen Inhibitors --

Signed and Sealed this

Twentieth Day of November, 2007

JON W. DUDAS
*Director of the United States Patent and Trademark Office*